(12) United States Patent
Seo et al.

(10) Patent No.: US 10,332,943 B2
(45) Date of Patent: Jun. 25, 2019

(54) TOUCH SENSOR INTEGRATED WITH OLED AND OLED DISPLAY DEVICE COMPRISING THE SAME

(71) Applicant: DONGWOO FINE-CHEM CO., LTD., Jeollabuk-do (KR)

(72) Inventors: Min Soo Seo, Gyeonggi-do (KR); Byung Jin Choi, Gyeonggi-do (KR); Cheol Hun Lee, Gyeonggi-do (KR); Sung Jin Noh, Gyeonggi-do (KR); Eung Goo Cho, Gyeonggi-do (KR)

(73) Assignee: DONGWOO FINE-CHEM CO., LTD., Jeollabuk-do (KR)

( * ) Notice: Subject to any disclaimer, the term of this patent is extended or adjusted under 35 U.S.C. 154(b) by 0 days.

(21) Appl. No.: 15/814,589

(22) Filed: Nov. 16, 2017

(65) Prior Publication Data

US 2018/0151627 A1 May 31, 2018

(30) Foreign Application Priority Data

Nov. 25, 2016 (KR) .......................... 10-2016-0158141

(51) Int. Cl.
*G06F 3/041* (2006.01)
*G06F 3/044* (2006.01)
*H01L 27/32* (2006.01)
*H01L 51/52* (2006.01)

(52) U.S. Cl.
CPC ............ *H01L 27/323* (2013.01); *G06F 3/044* (2013.01); *G06F 3/0412* (2013.01); *H01L 51/5206* (2013.01); *H01L 51/5221* (2013.01); *G06F 2203/04112* (2013.01)

(58) Field of Classification Search
CPC ................... G06F 3/0412; G06F 3/044; G06F 2203/04112; H01L 51/5221; H01L 27/323; H01L 51/5206
See application file for complete search history.

(56) References Cited

U.S. PATENT DOCUMENTS

| | | | |
|---|---|---|---|
| 2015/0301667 A1* | 10/2015 | Yano .................... | G06F 3/0412 345/173 |
| 2016/0026302 A1* | 1/2016 | Li .......................... | G06F 3/044 345/174 |
| 2016/0268533 A1* | 9/2016 | Lin ...................... | H01L 27/3211 |
| 2016/0291776 A1* | 10/2016 | Li ........................ | G06F 3/0416 |
| 2017/0069808 A1* | 3/2017 | Kim .................... | H01L 27/1248 |
| 2017/0168608 A1* | 6/2017 | Kim ...................... | G06F 3/0412 |
| 2018/0120971 A1* | 5/2018 | Lee ........................ | G06F 3/045 |

FOREIGN PATENT DOCUMENTS

KR 10-2014-0092366 A 7/2014

* cited by examiner

*Primary Examiner* — Charles V Hicks
(74) *Attorney, Agent, or Firm* — The PL Law Group, PLLC

(57) ABSTRACT

A touch sensor integrated with OLED includes an organic light emitting diode (OLED) device, a touch electrode having a mesh type and a self-capacitance type structure. The touch electrode is attached to a surface of the OLED device and included at least a double-layered structure that includes a metal layer and a metal oxide.

17 Claims, 3 Drawing Sheets ated with OLED and an OLED device including the same.

TOUCH SENSOR INTEGRATED WITH OLED AND OLED DISPLAY DEVICE COMPRISING THE SAME

CROSS-REFERENCE TO RELATED APPLICATION AND CLAIM OF PRIORITY

This application claims priority to Korean Patent Applications No. 10-2016-0158141 filed on Nov. 25, 2016 in the Korean Intellectual Property Office (KIPO), the entire disclosure of which is incorporated by reference herein.

BACKGROUND

1. Field

The present invention relates to a touch sensor integrated with an OLED and an OLED device including the same.

2. Description of the Related Art

As information technologies are being developed, various demands in display devices having thinner dimension, light-weight, high efficiency in power consumption are increasing. The display device may include a flat panel display device such as a liquid crystal display (LCD) device, a plasma display panel (PDP) device, an electro-luminescent display device, an organic light emitting diode (OLED) display device, etc.

The OLED display device are highlighted recently due to a high response speed, a high image quality, a wide viewing angle, a low power consumption, etc.

A touch panel capable of inputting a user's direction by selecting an instruction displayed in a screen is also developed. The touch panel may be equipped on a front face of a display device, and may convert a touched position by a user's hand or an individual tool into an electrical signal.

Accordingly, the instruction selected at the touched position may be accepted as an input signal. An individual input device such as a keyboard or a mouse which is connected to an image display device may be replaced with the touch panel, and thus an application of the touch panel has been expanded.

As described above, a touch screen panel including a touch sensor is employed in various image display devices as disclosed inv Korean Patent Publication No. 2014-0092366. However, more economically efficient and simple fabrication process for the touch sensor is needed.

SUMMARY

According to an aspect of the present invention, there is provided a touch sensor integrated with an OLED which may be prevented from being affected by a noise.

According to an aspect of the present invention, there is provided a touch sensor integrated with an OLED having reduced reflectivity and improved transmittance, and thus capable of providing an enhanced image quality.

According to an aspect of the present invention, there is provided a touch sensor integrated with an OLED which may have an improved bending property and may be employed in a flexible display device.

The above aspects of the present inventive concepts will be achieved by the following features or constructions:

(1) A touch sensor integrated with OLED, including an organic light emitting diode (OLED) device; and a touch electrode having a mesh type and a self-capacitance type structure, the touch electrode being attached to a surface of the OLED device and including at least a double-layered structure that includes a metal layer and a metal oxide layer.

(2) The touch sensor integrated with OLED according to the above (1), wherein the OLED device includes an anode, an organic layer including an organic emitting layer, a cathode and an encapsulation layer which are sequentially formed, wherein the touch electrode is formed on a surface of the encapsulation layer.

(3) The touch sensor integrated with OLED according to the above (2), further including a planarization layer on the surface of the encapsulation layer, wherein the touch electrode is formed on the planarization layer.

(4) The touch sensor integrated with OLED according to the above (2), wherein the encapsulation layer includes an organic layer or an organic-inorganic hybrid layer.

(5) The touch sensor integrated with OLED according to the above (1), wherein the OLED device includes a display region and a non-display region, and the touch electrode is formed only on the non-display region of the OLED device.

(6) The touch sensor integrated with OLED according to the above (1), wherein the OLED device includes a display region and a non-display region, and the touch electrode is formed only on the display region of the OLED device.

(7) The touch sensor integrated with OLED according to the above (1), wherein the OLED device includes a display region and a non-display region, and the touch electrode is formed both on the display region and the non-display region of the OLED device.

(8) The touch sensor integrated with OLED according to the above (1), wherein the metal layer includes at least one selected from the group consisting of silver, gold, copper, aluminum, platinum, palladium, chromium, titanium, tungsten, niobium, tantalum, vanadium, calcium, iron, manganese, cobalt, nickel, zinc and an alloy thereof.

(9) The touch sensor integrated with OLED according to the above (1), wherein the metal oxide layer includes at least one selected from the group consisting of indium tine oxide (ITO), indium zinc oxide (IZO), aluminum zinc oxide (AZO), gallium zinc oxide (GZO), indium tin zinc oxide (ITZO), zinc tin oxide (ZTO), indium gallium oxide (IGO), tin oxide (SnO2) and zinc oxide (ZnO).

(10) The touch sensor integrated with OLED according to the above (1), wherein a thickness of the metal oxide layer is in a range from 5 nm to about 200 nm.

(11) The touch sensor integrated with OLED according to the above (1), wherein a refractive index of the metal oxide layer at a wavelength of 550 nm is in a range from 1.7 to 2.2.

(12) The touch sensor integrated with OLED according to the above (1), wherein a thickness of the metal layer is in a range from 5 nm to about 250 nm.

(13) The touch sensor integrated with OLED according to the above (1), wherein the touch electrode includes a triple-layered structure that includes a first metal oxide layer, the metal layer and a second metal oxide layer sequentially formed from the OLED device.

(14) The touch sensor integrated with OLED according to the above (1), wherein the touch electrode includes a mesh pattern having a line width from 1 μm to 7 μm.

(15) The touch sensor integrated with OLED according to the above (3), wherein the planarization layer includes a refractive index matching layer.

(16) An OLED display device including the touch sensor integrated with OLED according to any one of the above (1) to (15).

The touch sensor integrated with an OLED according to an exemplary embodiment may be formed directly on an OLED device and may include a touch electrode of a self-capacitance type. Thus, the touch sensor may be prevented from being affected by a noise from an electrode of the OLED device, and may be substantially free of retransmission.

The touch sensor integrated with the OLED may have a mesh structure to have an improved bending property and flexibility. Thus, the touch sensor may be effectively used for a flexible display device.

The touch sensor integrated with the OLED may include the touch electrode which may have a double-layered structure of a metal layer and a metal oxide layer to improve a visibility in a screen.

DETAILED DESCRIPTION

Figure 1:
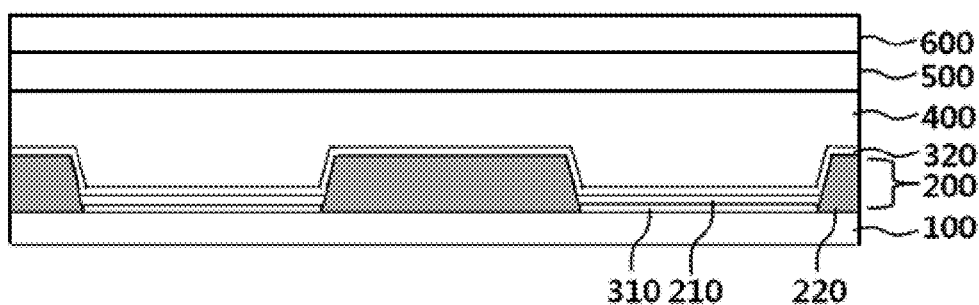
FIG. 1 is a cross-sectional view illustrating a touch sensor integrated with an OLED in accordance with an exemplary embodiment.

In the drawings, the thickness of layers, films, panels, regions, etc., are exaggerated for clarity. Also, in the drawings, the thickness of some layers and regions are exaggerated for the sake of brevity.

It will be understood that when an element such as a layer, film, region, or substrate is referred to as being "on" another element, it can be directly on the other element, or intervening elements may also be present.

According to an exemplary embodiment, a touch sensor integrated with an organic light emitting diode (OLED) includes an OLED device and a self-capacitance touch electrode having a mesh structure and including a metal layer and a metal oxide layer on the OLED device. The touch sensor may have improved bending, optical and electrical properties and may be employed in an OLED display device.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

The terms used herein "upper" and "lower" indicate relative locational relationships with reference to the accompanying drawings, and are not to be construed as limiting absolute locations.

Figure 2:
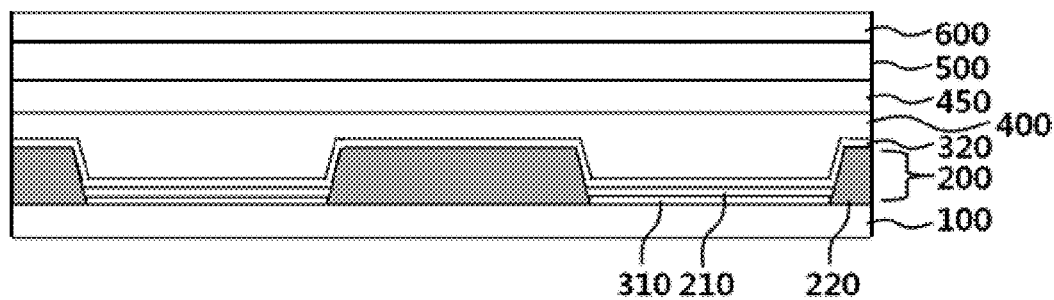
FIG. 2 is a cross-sectional view illustrating a touch sensor integrated with an OLED in accordance with an exemplary embodiment.

FIGS. 1 and 2 are schematic cross-sectional views illustrating touch sensors integrated with an OLED in accordance with an exemplary embodiment.

The touch sensor integrated with an OLED may include an OLED device and a self-capacitance touch electrode 500. The OLED device may include a substrate 100, an anode 310, an organic layer 200, a cathode 320 and an encapsulation layer 400. A protective layer 600 may be formed on the self-capacitance touch electrode 500.

The substrate 100 may include a material commonly used in an OLED device, for example, glass, a polymer, quartz or a ceramic. The polymer may include cyclo olefin polymer (COP), polyethylene terephthalate (PET), polyacrylate (PAR), polyetherimide (PEI), polyethylene naphthalate (PEN), polyphenylene sulfide (PPS), polyallylate, polyimide (PI), cellulose acetate propionate (CAP), polyether sulfone (PES), cellulose triacetate (TAC), polycarbonate (PC), cyclo olefin copolymer (COC), polymethylmethacrylate (PMMA), or the like. These may be used alone or in a combination thereof. Preferably, the substrate 100 may include polyimide.

The OLED device may be divided into a display region and a non-display region. An OLED may be disposed in the display region to form a pixel, and pixels neighboring each other may be separated or divided by the non-display region. Referring to FIG. 1, a region between the neighboring non-display regions 220 may be defined as the display region. The anode 310, an organic light emitting layer 210 and the cathode 320 may be sequentially formed in the display region. For example, the non-display region 220 may include a black matrix formed of a cured resin. Thus, the organic light emitting layer 210 and the non-display region 220 are defined as the organic layer 210 herein. However, the non-display region 220 is not limited as only including an organic material.

The encapsulation layer 400 may be formed on the cathode 320. An organic material included in the organic light emitting layer 210 may be oxidized when contacting moisture or oxygen to degrade a lifetime of the OLED device. Accordingly, the encapsulation layer 400 may serve as a barrier layer to prevent a permeation of oxygen, and may further serve as an optical or electrical shielding layer.

The encapsulation layer 400 may have a structure commonly used in the related art, and may include, e.g., a glass substrate, an organic layer or an organic-inorganic hybrid layer. The encapsulation layer 400 may include the organic layer or the organic-inorganic hybrid layer for improving a flexible property.

In some embodiments, a planarization layer 450 may be further formed on the encapsulation layer 400 so that touch electrodes may be uniformly formed thereon. The planarization layer 450 may further include a refractive index matching layer (IML) for improving an image quality. For example, the IML layer may include an organic layer or an inorganic layer formed using a material commonly known in the related art.

The self-capacitance touch electrode 500 may be formed or attached on the encapsulation layer 400 or the planarization layer 450. In an embodiment, the self-capacitance touch electrode 500 may be attached to the encapsulation layer 400 or the planarization layer 450 by an adhesive member. In an embodiment, the self-capacitance touch electrode 500 may be directly formed on the encapsulation layer 400 or the planarization layer 450 by a deposition process such as a sputtering process so that a bending property may be improved and a thickness of the OLED device may be reduced.

Figure 3:
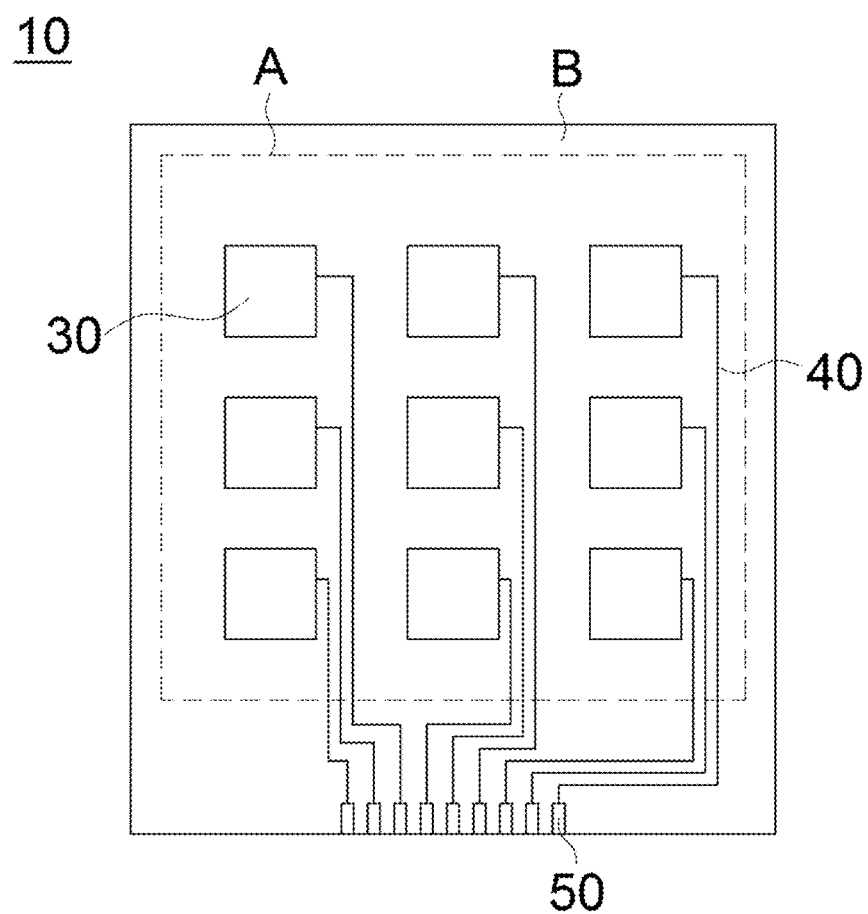
FIG. 3 is a schematic top plane view illustrating a touch sensor of a self-capacitance type.
Figure 4:
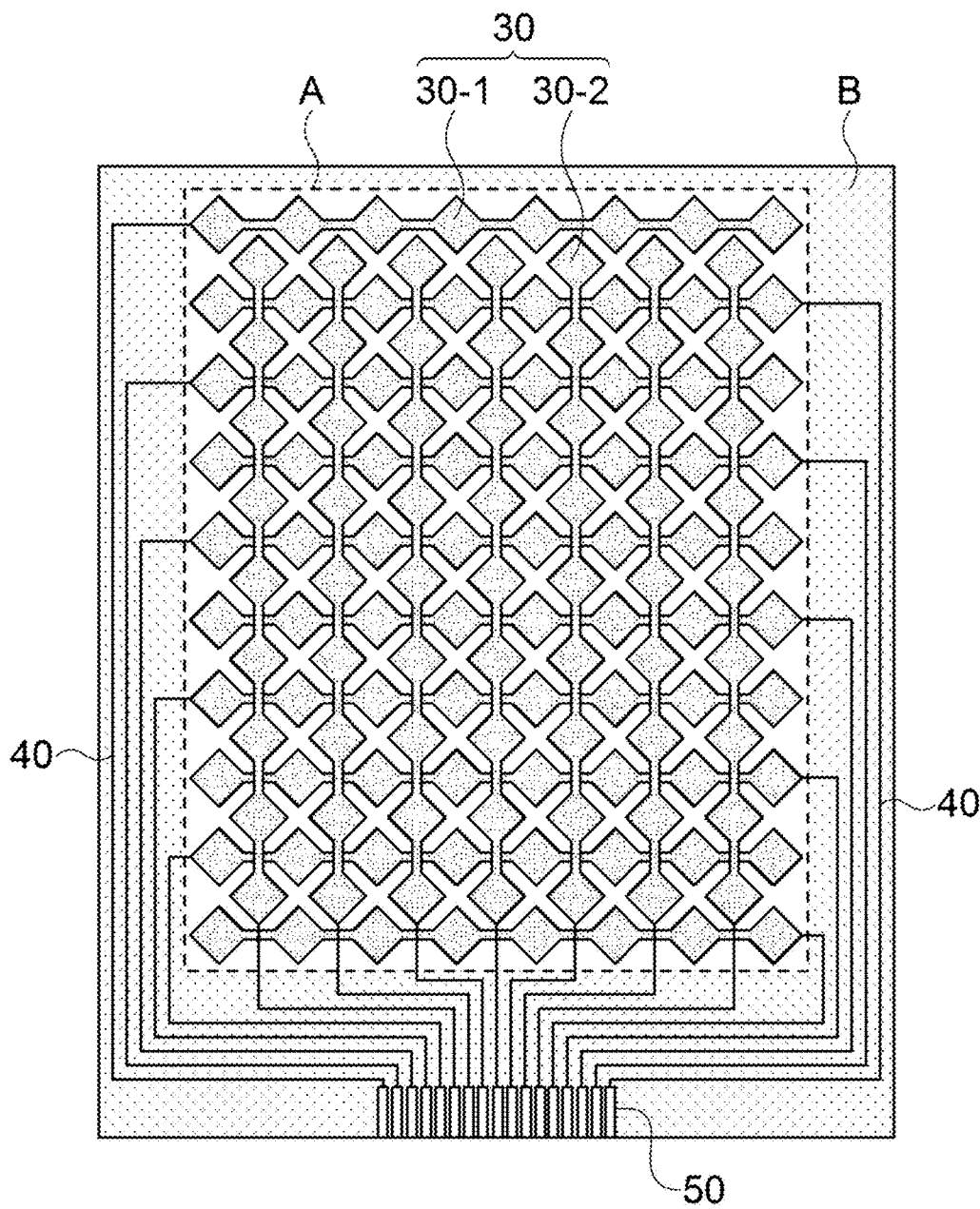
FIG. 4 is a schematic top plane view illustrating a touch sensor of a mutual-capacitance type.

The touch electrode according to an exemplary embodiment may be a self-capacitance type. FIG. 3 is a schematic top plane view illustrating a touch sensor of a self-capacitance type. FIG. 4 is a schematic top plane view illustrating a touch sensor of a mutual-capacitance type.

As illustrated in FIG. 4, a mutual-capacitance type touch electrode structure 20 may include unit sensing electrodes that may include a transmission electrode 30-1 and a reception electrode 30-2. An insulation layer (not illustrated) is needed at an intersection area of the transmission electrode 30-1 and the reception electrode 30-2 such that the transmission electrode 30-1 and the reception electrode 30-2 are insulated from each other. Thus, at least triple-layered structure is formed at the intersection area.

However, as illustrated in FIG. 3, a self-capacitance type touch electrode structure 10 may include unit sensing electrodes 30, each of which may be connected to a trace 40. Thus, an intersection area of the unit sensing electrodes 30 may not be generated. A signal of the unit sensing electrode 30 may be transferred to an external circuit such as a flexible printed circuit board (FPCB) by the trace 40 via an electrode pad 50. Therefore, a single-layered touch electrode which may have improved bending property and reliability compared to that of the mutual-capacitance type touch electrode (e.g., at least partially including the triple-layered structure) may be obtained.

According to an exemplary embodiment, the touch electrode may be directly formed on the OLED device, and thus may be easily affected by a noise from an electrode included in the OLED device. Thus, the self-capacitance type touch electrode structure may be employed to be less affected by the noise than the mutual-capacitance type touch electrode structure.

The touch electrode 500 according to an exemplary embodiment may have a double-layered structure including a metal layer and a metal oxide layer so that a reflectivity of an incident light may be reduced, and a transmittance may be increased. When the metal layer having a high reflectivity is solely used, an image quality may be degraded. However, according to embodiments of the present invention, the metal oxide layer may be added to decrease the reflectivity and improve the transmittance.

In a conventional mutual-capacitance touch electrode structure, a metal bridge electrode may be used at the intersection area of the unit sensing electrodes to further degrade the image quality. To resolve the above problem, a self-capacitance touch electrode in a conventional OLED device may be selectively formed at a region corresponding to a non-display region of the OLED device (e.g., a region on or under the non-display region).

However, the touch electrode 500 according to an exemplary embodiment may have the double-layered structure, and may be formed on the non-display region and also on the display region. In some embodiments, the touch electrode 500 may be formed at regions corresponding to both the non-display region and the display region. In some embodiments, the touch electrode 500 may be selectively formed at the region corresponding to the display region.

In some embodiments, the touch electrode 500 may have a triple-layered structure including a first metal oxide layer, a metal layer and a second metal oxide layer which may be sequentially stacked in consideration of reducing the reflectivity of the touch electrode and improving the transmittance.

According to an exemplary embodiment, the metal layer may be formed of a metal having improved conductivity and low sheet resistance. Non-limiting examples of the metal may include silver, gold, copper, aluminum, platinum, palladium, chromium, titanium, tungsten, niobium, tantalum, vanadium, calcium, iron, manganese, cobalt, nickel, zinc or an alloy thereof. Preferably, the metal layer may be formed of silver, gold, copper, palladium, aluminum or an alloy thereof to further improve a bending property. More preferably, the metal layer may be formed of an alloy of silver, copper and palladium (Ag—Pd—Cu: APC).

According to an exemplary embodiment, the metal oxide layer may be formed of a transparent metal oxide, e.g., indium tine oxide (ITO), indium zinc oxide (IZO), aluminum zinc oxide (AZO), gallium zinc oxide (GZO), indium tin zinc oxide (ITZO), zinc tin oxide (ZTO), indium gallium oxide (IGO), tin oxide ($SnO_2$), or zinc oxide (ZnO). These may be used alone or in a combination thereof. Preferably, at least one of ITO and IZO may be used to further improve image quality and being property. More preferably, IZO may be used.

According to an exemplary embodiment, if the touch electrode 500 includes the first metal oxide layer and the second metal oxide layer, the first oxide layer and the second oxide layer may include the same material or different materials. Preferably, the first metal oxide layer and the second metal oxide layer may each include at least one of ITO and IZO. More preferably, the first metal oxide layer and the second metal oxide layer may each include IZO.

Thicknesses of the metal layer and the metal oxide layer may not be specifically limited. In some embodiments, the thickness of the metal oxide layer may be in a range from about 5 nm to about 200 nm and the thickness of the metal layer may be in a range from about 5 nm to about 250 nm in consideration of high transmittance, low reflectivity and improved bending property. More preferably, the thickness of the metal oxide layer may be in a range from about 30 nm to about 50 nm and the thickness of the metal layer may be in a range from about 8 nm to about 15 nm.

If the touch electrode 500 has the triple-layered structure including the first metal oxide layer, the metal layer and the second metal oxide layer, the first and second metal oxide layers may have relatively high refractive indexes, and the metal oxide layer may have a relatively low refractive index. Thus, a mesh type electrode pattern having a structure of high refractive index-low refractive index-high refractive index may be obtained so that the touch electrode 500 may have both high transparency and low reflectivity to have remarkably improved optical property. For example, the refractive index of the first metal oxide layer and the second metal oxide layer at a wavelength of 550 nm may each be in a range from about 1.7 to about 2.2. The refractive index of the metal layer at a wavelength of 550 nm may be in a range from about 0.1 to about 1.0, and an extinction coefficient may be in a range from about 2.0 to about 7.0. The extinction coefficient may be measured by Equations 1 and 2.

$$I = I_0 e^{(-\alpha T)} \quad \text{[Equation 1]}$$

In the Equation 1, α represents an absorption coefficient, T represents a thickness, $I_0$ represents a light intensity before transmission, and I represents a light intensity after transmission.

$$\alpha = 4\pi k / \lambda_0 \quad \text{[Equation 2]}$$

In the Equation 2, α represents an absorption coefficient, k represents an extinction coefficient, and $\lambda_0$ represents a wavelength.

The touch electrode 500 may have the mesh type electrode structure to have improved bending and restoring properties, and low sheet resistance. From this aspect, a line width of the mesh type electrode may be in a range from about 1 μm to about 7 μm.

According to an exemplary embodiment, the protective layer 600 may be formed on the touch electrode 500. The protective layer may protect and insulate the touch electrode from an external environment.

The protective layer 600 may include a material capable of protecting a touch electrode commonly used in the related art. For example, the protective layer 600 may include an organic layer, an inorganic oxide layer or an organic-inorganic hybrid layer.

The touch sensor integrated with OLED according to example embodiments may be applied to an OLED display device. The touch sensor integrated with OLED may have remarkably improved image visibility, and bending and electrical properties to be effectively applied to a flexible image display device.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A touch sensor integrated with OLED, comprising:
an organic light emitting diode (OLED) device; and
a touch electrode being a self-capacitance touch electrode including unit sensing electrodes each of which is connected to a trace, the touch electrode having a mesh structure, the touch electrode attached to the OLED device, the touch electrode including at least two layers that include a metal layer and a metal oxide layer.

2. The touch sensor integrated with OLED of claim 1, wherein the OLED device includes an anode, an organic layer including an organic light emitting layer, a cathode and an encapsulation layer which are sequentially formed, wherein the touch electrode is formed on the encapsulation layer.

3. The touch sensor integrated with OLED of claim 2, further comprising a planarization layer formed between the encapsulation layer and the touch electrode.

4. The touch sensor integrated with OLED of claim 2, wherein the encapsulation layer includes an organic layer or an organic-inorganic hybrid layer.

5. The touch sensor integrated with OLED of claim 1, wherein the OLED device includes a display region and a non-display region, and the touch electrode is formed only on the non-display region of the OLED device.

6. The touch sensor integrated with OLED of claim 1, wherein the OLED device includes a display region and a non-display region, and the touch electrode is formed only on the display region of the OLED device.

7. The touch sensor integrated with OLED of claim 1, wherein the OLED device includes a display region and a non-display region, and the touch electrode is formed both on the display region and the non-display region of the OLED device.

8. The touch sensor integrated with OLED of claim 1, wherein the metal layer includes at least one selected from the group consisting of silver, gold, copper, aluminum, platinum, palladium, chromium, titanium, tungsten, niobium, tantalum, vanadium, calcium, iron, manganese, cobalt, nickel, zinc and an alloy thereof.

9. The touch sensor integrated with OLED of claim 1, wherein the metal oxide layer includes at least one selected from the group consisting of indium tine oxide (ITO), indium zinc oxide (IZO), aluminum zinc oxide (AZO), gallium zinc oxide (GZO), indium tin zinc oxide (ITZO), zinc tin oxide (ZTO), indium gallium oxide (IGO), tin oxide ($SnO_2$) and zinc oxide (ZnO).

10. The touch sensor integrated with OLED of claim 1, wherein a thickness of the metal oxide layer is in a range from 5 nm to about 200 nm.

11. The touch sensor integrated with OLED of claim 1, wherein a refractive index of the metal oxide layer at a wavelength of 550 nm is in a range from 1.7 to 2.2.

12. The touch sensor integrated with OLED of claim 1, wherein a thickness of the metal layer is in a range from 5 nm to about 250 nm.

13. The touch sensor integrated with OLED of claim 1, wherein the touch electrode has a double-layered structure that includes the metal layer and the metal oxide layer.

14. The touch sensor integrated with OLED of claim 1, wherein the touch electrode has a triple-layered structure that includes the metal oxide layer comprised of a first metal oxide layer and a second metal oxide layer, and the metal layer; and
the first metal oxide layer, the metal layer and the second metal oxide layer sequentially formed from the OLED device.

15. The touch sensor integrated with OLED of claim 1, wherein the mesh structure has a mesh pattern having a line width from 1 μm to 7 μm.

16. The touch sensor integrated with OLED of claim 3, wherein the planarization layer includes a refractive index matching layer.

17. An organic light emitting diode display device comprising the touch sensor integrated with OLED of claim 1.

* * * * *